(12) United States Patent
Schmatz et al.

(10) Patent No.: US 7,418,069 B2
(45) Date of Patent: Aug. 26, 2008

(54) CLOCK DATA RECOVERING SYSTEM WITH EXTERNAL EARLY/LATE INPUT

(75) Inventors: Martin Schmatz, Rueschlikon (CH); Hayden C. Cranford, Cary, NC (US); Vernon R. Norman, Cary, NC (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/966,438

(22) Filed: Dec. 28, 2007

(65) Prior Publication Data

US 2008/0112521 A1 May 15, 2008

Related U.S. Application Data

(63) Continuation of application No. 10/484,608, filed on Jan. 20, 2004, now Pat. No. 7,315,594.

(30) Foreign Application Priority Data

Jul. 27, 2001 (EP) ................... 01118197

(51) Int. Cl.
*H04L 7/00* (2006.01)
(52) U.S. Cl. .................................. 375/355
(58) Field of Classification Search ........... 375/354, 375/355, 357, 369, 371, 372, 373, 374; 370/395.62, 370/507; 455/265; 702/89; 713/375, 400
See application file for complete search history.

(56) References Cited

U.S. PATENT DOCUMENTS 6,570,944 B2 * 5/2003 Best et al. ................. 375/355

OTHER PUBLICATIONS

Gabara, an 0.25 um CMOS Injection Locked 5.6Gb/s Clock and Data Recovery Cell, Integrated Circuits and Systems Design, 1999, p. 84-87.*

* cited by examiner

*Primary Examiner*—Sam K Ahn
(74) *Attorney, Agent, or Firm*—Louis J. Percello

(57) ABSTRACT

The invention is directed to a clock data recovery system for resampling a clock signal according to an incoming data signal. The clock data recovery system comprises a clock generator for generating the clock signal and a phase adjustment unit for generating sampling phases dependent on a phase adjustment control signal. It also comprises a data sampling unit operable to generate a stream of input samples and an edge detector for generating therefrom an internal early signal and an internal late signal. A phase adjustment control unit is disposed for generating under use of the early signal and the late signal the phase adjustment control signal. The phase adjustment control unit is feedable with an external early/late signal and/or comprises an output for delivering an export early/late signal.

20 Claims, 4 Drawing Sheets

CLOCK DATA RECOVERING SYSTEM WITH EXTERNAL EARLY/LATE INPUT

CROSS-REFERENCE TO RELATED APPLICATION

This is a continuation of and claims priority to U.S. patent application Ser. No. 10/484,608 filed on Jan. 20, 2004, now issued as U.S. Pat. No. 7,315,594.

The invention relates to a clock data recovery system with an input for external early/late information. It more particularly relates to a global phase-update functionality for digital CDR loops in serial busses. It also relates to a clock-generation system and a method for resampling a clock signal.

TECHNICAL FIELD AND BACKGROUND OF THE INVENTION

In "A Semidigital Dual Delay-Locked Loop" by S. Sidiropoulos and M. A. Horowitz, IEEE Journal of solid-state circuits, vol. 32, no. 11, November 1997 a dual delay-locked loop architecture is described which achieves low jitter, unlimited phase shift, and a large operating range. The architecture employs a core loop to generate coarsely spaced clocks, which are then used by a peripheral loop to generate the main system clock through phase interpolation.

U.S. Pat. No. 5,134,637 discloses an improved clock recovery enchancement circuit that is particularly adapted for solving the problem caused by an incoming signal that is asymmetric and comprises a sub-harmonic tone of the bit rate clock, that is 180° out of phase with the recovering clock, thereby causing the data edges to appear to be locked. The clock recovery enhancement circuit, provides a window signal near a predefined edge of the recovering clock which creates a disable signal such that clock adjustments may be biased towards one direction. The generation of early/late information is therein defined as determining whether the detected data edge is early or late with respect to the corresponding edge of the recovered clock signal. If the detected data edge is early, then the recovered clock signal is accelerated by a recovery adjustment unit of time and, if the detected data edge is late, then the recovered clock signal is retarded by a like amount of time.

OBJECT AND ADVANTAGES OF THE INVENTION

According to a first aspect of the invention as set forth in the claims the clock data recovery system is feedable with external early/late information. This has the advantage that the clock data recovery system can enhance its internal early/late information with that external early/late information. This provides particularly useful when the internal early/late information is not accurate enough to guarantee a stable and precise clock. This can for instance be the case when a so-called killer packet arrives at the data input. Since in such a case an insufficient number of edges arrives at the clock data recovery system, the clock recovery would be unsatisfactory and could lead to errors. Having the external early/late information available in the clock data recovery system, that information can be used instead or in addition to the internal early/late information, such that clock recovery is less prone to insufficient edge density of the input signal. The clock data recovery system is assigned to a single circuitry unit, also referred to as macro. The generated recovered clock is valid within the macro's boundaries.

An override control signal can be used to advantageously determine a priority between the internal early/late signal and the external early/late signal. Thereby the optimum combination of both pieces of early/late information can be determined.

Another advantage is to provide an output for delivering an export early signal and an export late signal. These export signals are then advantageously receivable by one or more other macros who again can make use of the export signals as external early/late information for themselves.

The external early/late signal can also be received from an external early/late processing unit. That unit is perceived as a sort of central or global receiver for several export signals, and combining them to a general or global early/late signal. This has the advantage that an averaging effect determines the global early/late signal which averages out errors or other inaccuracies. The global early/late signal can then be made available as the external early/late signal to those macros who can advantageously utilise that global early/late signal for their own clock data recovery. Hence it would be of advantage to if the early/late processing unit comprises a combinatorial logic for combining the export early signal with other export early signals and combining the export late signal with other export late signals.

The clock data recovery system can further comprise an averaging filter for averaging a multitude of logic highs of the early signal to form an incrementing signal for a counter and for averaging a multitude of logic highs of the late signal to form a decrementing signal for the counter, whose reading is transformable into the phase adjustment control signal. Here an internal averaging would be performed which smooths the effect of the early resp. late signal on the counter. Thereby a sort of low-pass filter behavior is achieved which renders the phase adjustment smoother and less prone to high-frequent distortions in the data signal.

The internal early signal and the internal late signal can be a multitude of sub-rate signals that are combined to a pre-processed early signal and a pre-processed late signal. This allows the parallel processing of several data bits at lower speed to save power and to increase the maximum operating frequency for a given implementation technology. The rate at which the phase information is then processed is equal to the data rate divided by the number of parallel processed bits. Due to the fact that phase information based on a bit transition is not present between any two bits, e.g. no phase information can be generated if the logic levels of two consecutive bits is equal, it is also preferable to accumulate the information gained from the random bit transitions over several bit cycles before converting it into early and late signals. This increases the probability that an early or late pulse can be generated within one analyzing cycle that simultaneously processes several bits.

SUMMARY OF THE INVENTION

The invention is directed to a clock data recovery system for resampling a clock signal according to an incoming data signal. The clock data recovery system comprises a clock generator for generating the clock signal and a phase adjustment unit for generating sampling phases dependent on a phase adjustment control signal. It also comprises a data sampling unit operable to generate a stream of input samples and an edge detector for generating therefrom an internal early signal and an internal late signal. A phase adjustment control unit is disposed for generating under use of the early signal and the late signal the phase adjustment control signal.

The phase adjustment control unit is feedable with an external early/late signal and/or comprises an output for delivering an export early/late signal.

Hereinafter, in any case where the term "phase" is mentioned also the term "frequency" is meant. Also, in any case "early/late" is mentioned, this means early and/or late.

The external early/late signal helps the clock data recovery system for resampling the clock signal, since it enhances the total available early/late information. This is particularly helpful if the internal early/late information in form of the internal early signal and the internal late signal is not sufficient. This can be the case if the edge density of the incoming data signal is low. The external early/late information is preferably fed to the clock data recovery system, being a first clock data recovery system, from a different clock data recovery system, i.e. a second clock data recovery system that creates its own internal early/late information and exports that as external early/late information. That second clock data recovery system then has its own incoming data signal leading to a different early/late information than the early/late information already present in the first clock data recovery system.

A particular example would hence be two of the claimed clock data recovery systems feeding each other with their internal early/late information which for the receiving clock data recovery system is external early/late information. With other words the clock data recovery systems help each other with their early/late information being exchanged.

A model involving more than two clock data recovery systems would preferably involve an early/late processing unit that handles all exported early/late information being exported from the multiple clock data recovery systems and incoming at that early/late processing unit and generates the external early/late information which is made available to the clock data recovery systems.

With other words the described arrangement provides an external update functionality for a digital CDR loop. An application therefor could be in a scrambled serial bus structure where all serial link transmitters are timed from the same clock, but where a clock offset between the separate transmitter and receiver circuits might exist. Due to the potentially very long run length, i.e. consecutive transmission of ones or zeros in such applications, it is of advantage if the clock frequency information is shared between the individual serial links that form the bus.

The performance of the external update functionality is based on the fact that low frequency and especially static jitter components are typically highly correlated across a chip. A good example is a constant clock offset due to the frequency tolerance of the quartz reference. This offset is common to all circuits on the chip that use a clock that is referenced back to the quartz, and all resulting jitter components are fully correlated for all serial links in the bus.

The clock data recovery system can also only have an output for delivering an export early/late signal. This clock data recovery system then serves as source for the external early/late information for a different clock data recovery system or for the early/late processing unit, or simply for monitoring purposes or any combination of these.

The invention also is directed to a clock-generating system, for generating a clock, comprising a clock generator and a phase adjustment unit that is connected to the clock generator. The phase setting of the phase adjustment unit is controllable via a phase adjustment control signal from a phase adjustment control unit that comprises an input for an external early/late signal that is independent from an output signal of the phase adjustment unit. This allows a clock generation based on an external early/late signal.

Another aspect of the invention is directed to a method for resampling a clock signal according to an incoming data signal comprising the steps of generating the clock signal, generating under use of the clock signal sampling phases dependent on a phase adjustment control signal, and generating a stream of input samples under use of the sampling phases. It furthermore comprises the steps of generating based thereupon an internal early signal and an internal late signal, generating in a phase adjustment control unit under use of the early signal and the late signal the phase adjustment control signal, and feeding the phase adjustment control unit with an external early/late signal, and/or delivering from the phase adjustment control unit an export early/late signal based on the internal early signal and an internal late signal.

DESCRIPTION OF THE DRAWINGS

Preferred embodiments of the invention are depicted in the drawings and described in detail below by way of example. It is shown in FIG. 1 a high-level block diagram of a digital CDR loop, FIG. 2 a high-level block diagram of an early/late pre-processing and a code generation unit, FIG. 3 a block diagram of an early-and-late-reduction unit combining internal early/late signals with external early/late information, FIG. 4 a schematic view of several macros feeding their early/late information to a global early/late processing unit.

All the figures are for sake of clarity not shown in real dimensions, nor are the relations between the dimensions shown in a realistic scale.

DETAILED DESCRIPTION OF PREFERRED EMBODIMENTS

In the following, the various exemplary embodiments of the invention are described.

Figure 1:
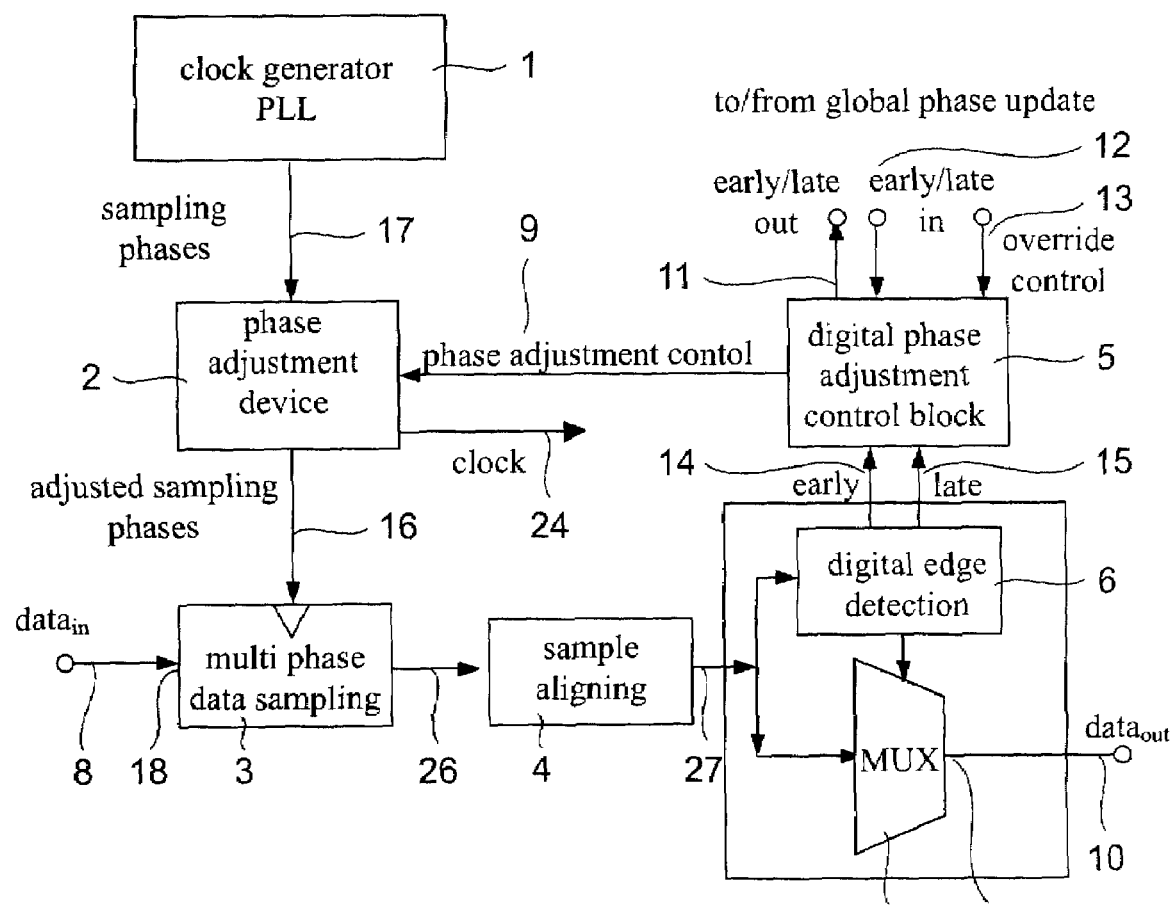

FIG. 1 shows a high-level diagram of a digital clock data recovery (CDR) loop. A phase adjustment unit 2 is arranged between a clock generator 1 (PLL) and a multi-phase data sampling unit 3 that has a data input 18 and is connected via a sample-aligning stage 4 to a digital edge-detector 6 and to a multiplexer 7. That multiplexer 7 receives also input from the edge-detector 6 and has a data output 19. Two outputs of the edge-detector 6 are connected to a digital phase adjustment control unit 5 which feeds one of its outputs to the phase adjustment unit 2.

Sampling phases 17 are generated in the clock generator 1 and fed into the phase adjustment unit 2. At the output of this phase adjustment unit 2, adjusted sampling phases 16 arrive and are used to sample an analog input data signal 8 arriving at the data input 18, to convert it into a serial stream of digital input samples 26 that are fed to the sample-aligning stage 4 to get a parallel representation 27 of the serialized input samples 26. After passing that sample-aligning stage 4, the parallelized input samples 27 are fed to the edge-detector 6 which controls on one side the selection of the optimum data-representing sample therefrom, on the other side it generates an internal early signal 14 and an internal late signal 15, which carry the currently measured phase offset between the data stream of the input data signal 8 and the used adjusted sampling phases 16. The phase adjustment control unit 5 processes these early/late signals 14, 15, e.g. by low-pass filtering them, and generates a phase adjustment control signal 9 to adjust the sampling phases 16 of the phase adjustment unit 2. The phase adjustment unit 2 generates a clock signal 24 with the adjusted phase. The multiplexer 7 multiplexes the input samples 27 to a serial data out stream, i.e. an output signal 10 at the data output 19.

In addition to the basic CDR functionality described in the previous paragraph, an addition of control signals 11, 12, 13 to and from the phase adjustment control unit 5 is provided as shown in FIG. 1. An access to a preprocessed form of the early and late signals 14, 15 from the edge-detector 6 is enabled, and it is made possible to feed update information in form of an external early/late signal 11 into the phase adjustment control unit 5 from an external unit such as a global early/late processing unit. An override control signal 13 is added to statically or dynamically define the priority that the external early/late signal 12 has compared to the internal early and late signals 14, 15. More precisely the override control signal 13 determines the mode of combination between the external early/late signal 12 and the internal early and late signals 14, 15. That mode can for instance specify that one of the signals 12, 14, 15 overrides the other in any case, or that only one of the signals 12, 14, 15 is to be used in any case. It may also specify a weighting for a combination of the signals 12, 14, 15.

The clock data recovery (CDR) loop belongs to a macro, which is to be seen as a unit that receives the data signal 8 from an external source and uses that data signal 8 for clock recovery for providing the recovered clock signal to its internal circuitry. The clock recovery avoids the necessity of shipping a clock signal from that external source to the macro.

Figure 2:
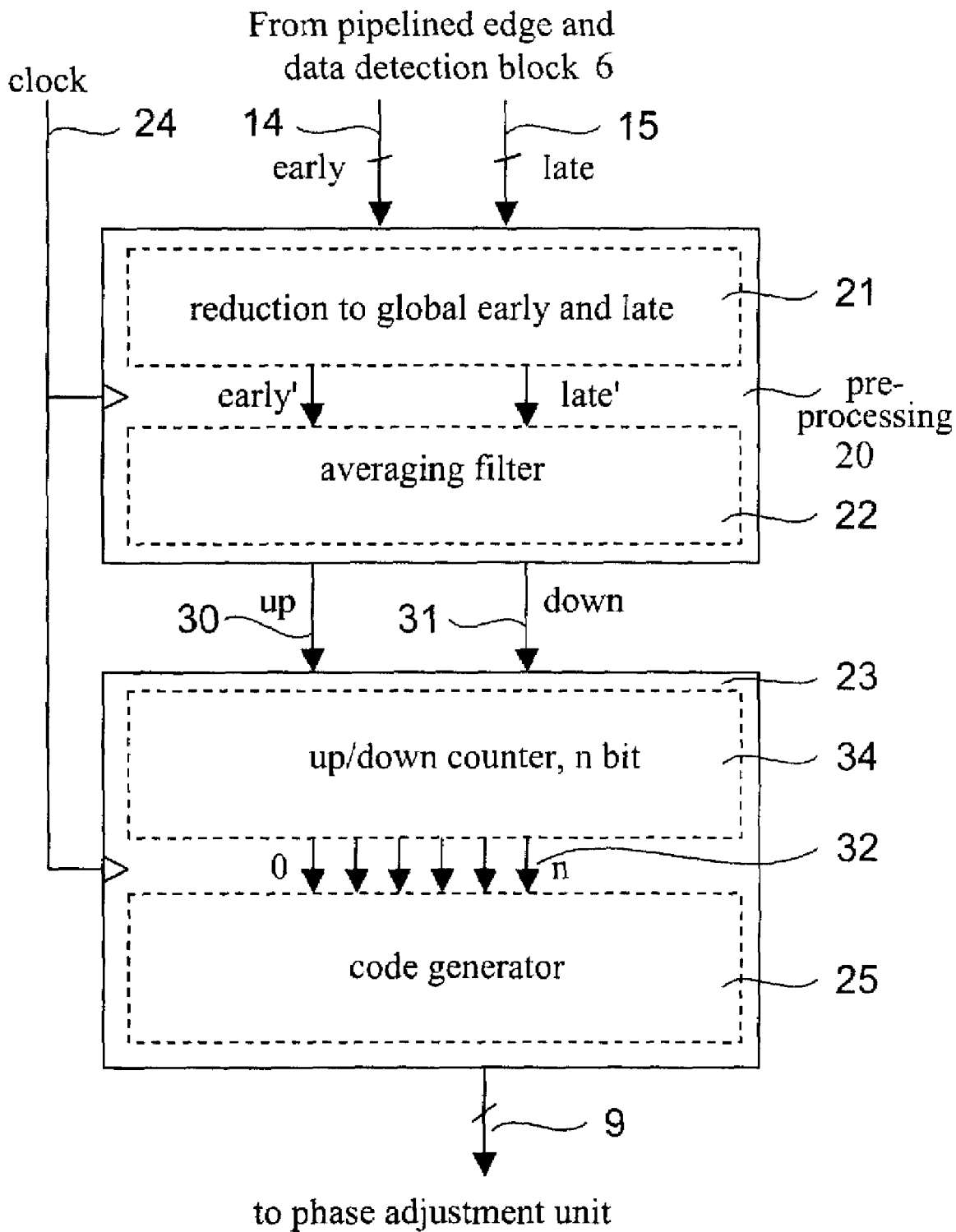

FIG. 2 shows a high-level view of the signal path from the data/edge correlation logic, i.e. the edge-detector 6, to the phase rotator control signals, i.e. the phase adjustment control signal 9. The depicted arrangement is hence a preciser view of the phase adjustment control unit 5 of FIG. 1. It comprises a pre-processing stage 20 that receives the early and late signals 14, 15 and the clock 24. The pre-processing stage 20 itself comprises an early-and-late-reduction unit 21 that receives the early and late signals 14, 15 and outputs an early' signal 28 and a late' signal 29. This allows the parallel processing of several data bits at lower speed as described above. These two signals 28, 29 are input to an averaging filter 22 which itself outputs an up signal 30, also referred to as incrementing signal 30, and a down signal 31, also referred to as decrementing signal 31. These two signals 30, 31 are input to a code generation unit 23 that comprises at its input side an up/down counter 34 whose output is fed to a code generator 25 to generate a control signal that is defining the phase setting of the phase adjustment unit 2.

The early-and-late-reduction unit 21 performs a summation of the early/late signals 14, 15. The m-bit early/late signals 14, 15 can e.g. be subrate signals running at 1/m rate of a normal signal. This means that there is in fact not a single early signal 14 but there are m such early signals 14. The same applies to the late signal 15.

The combinatorial global-early-and-late-reduction unit 21 generates a logic high signal for the early' signal 28 in the case that the number of early signals 14 that are showing a logic high is bigger than the number of late signals 15 with a logic high. The late' signal 29 goes high if more of the late signals 15 are showing a logic high than the number of early signals 14 with logic high. In the case that the number of logic highs from the early signals 14 and late signals 15 are equal, both outputs, the early' signal 28 and late' signal 29 are logic low. This corresponds to a subtraction of the number of early signals 14 from the number of late signals 15, or vice versa, with the result limited to one or zero. The early' and late' signals 28, 29 are hence pre-processed early and late signals 14, 15 and fed to the averaging filter 22 at quarter rate.

The averaging filter 22 reduces the number of logic highs on the early' output 28 to an up signal 30. E.g. every three logic highs of the early' signal 28 lead to a logic high of the up signal 30. The same applies to the late' signal 29 and the down signal 31. This results in a smoother following of the local clock to the data.

The up/down counter 34 combines the up signal 30 and the down signal 31 to a single number. If neither of the up signal 30 and the down signal 31 is logic high, the count is not altered. If only the up signal 30 is logic high, the counter 34 is incremented. If only the down signal 31 is logic high, the counter 34 is decremented. A logic high on the lop signal 30 and on the down signal 31 is not possible and hence has no effect on the counter 34. The counter 34 has n-bits and those are fed as counter reading 32 to the code generator 25 where that input is transformed into a phase information for the phase adjustment unit 2.

The early-and-late-reduction unit 21 is further enhanced. With that enhancement, early and late information of the macro can be accessed outside of the macro, and also early and late information can be fed from outside the macro into its CDR loop. This enables the global processing of clock phase information in scrambled serial bus structures. A scrambled serial bus structure is a bus whereupon data is transmitted in scrambled form to reduce the probability of long chains of consecutive zeros or ones. Nevertheless also in such a structure it is possible that such a chain, also referred to as killer packet, occurs, which would create a problem for the receiving macro since thereby for a longer time period no edge for the CDR loop arrives which negatively effects the clock recovery.

Such a problem can be circumvented in that phase update information may be transferred from an external unit to a macro to force phase updates therein even without having timing information available locally in that macro. The performance of the individual CDR loop is significantly enhanced because clock offsets are tracked more accurately. It is envisaged to have a multitude of macros of that type that internally generate early/late information and make it available to the other macros. Due to the fact that the timing information is obtained from measurements in several different macros, a higher averaging factor is enabled. This in turn suppresses other noise effects with higher efficiency.

Figure 3:
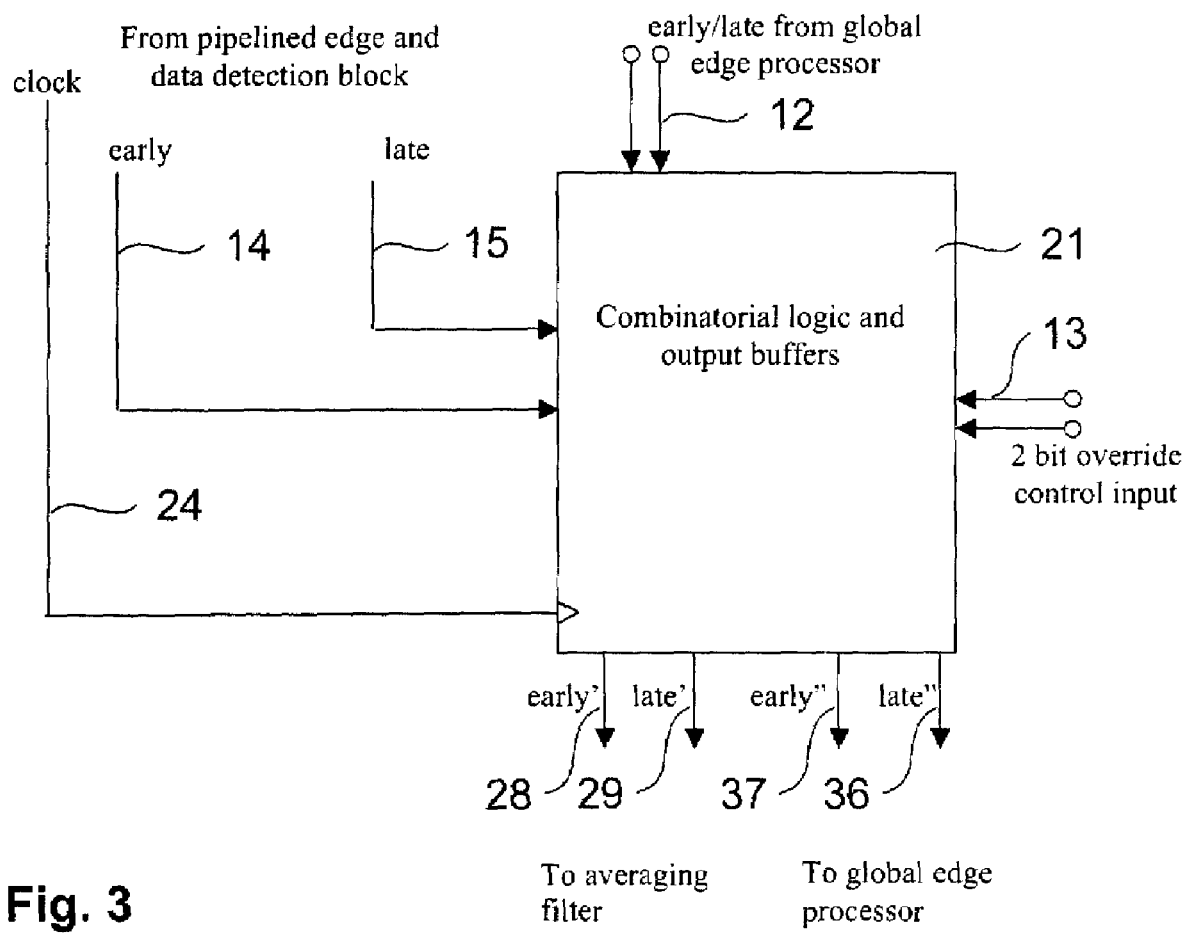

FIG. 3 shows a simplified schematic of the enhanced early/late processing unit, i.e. the early-and-late-reduction unit 21. This early-and-late-reduction unit 21 receives the early signal 14 and the late signal 15 as well as the clock 24. It also receives external early/late information 12, also referred to as external early/late signal 12, from an external early/late processing unit, also referred to as global edge processor, and provides an early" signal 37 and a late" signal 36 to that global edge processor. Furthermore the early-and-late-reduction unit 21 has an input for a 2-bit override control signal 13. The signals that are fed from the early-and-late-reduction unit 21 into the macro-internal averaging filter 22 are labeled as early' signal 28 and late' signal 29. The early" signal 37 and late" signal 36 are also referred to as export signals 36, 37 because they are via the output 11, depicted in FIG. 1, made available outside of the macro in which they have been generated.

The early" signal 37 and late" signal 36 are generated using only macro-internal timing information from the analyzed bits, i.e. the early" signal 37 and late" signal 36 correspond to the early signal 14 and the late signal 15. The early" signal 37 and late" signal 36 might be identical to the early signal 14 and the late signal 15, but these might also be processed within the phase adjustment control unit 5 to form the early" signal 37 and late" signal 36. In particular, the phase adjustment control unit 5 might further reduce the frequency of the early" signal 37 and late" signal 36 with respect to the early signal 14 and late signal 15. The early' signal 28 and late' signal 29 carry additional information gained from the global edge processor, namely the external early/late information 12 arriving therefrom.

The two additional static input bits of the override control signal 13 are fed to the combinatorial early-and-late-reduction unit 21. These two signals 13 control four different modes of how the external early/late information 12 from the global edge processor is used for generating the early' and late' signals 28, 29. In the following table the result for the respective states of the override control signal 13 on the use of external early/late information 12 and of the internal early signal 14 and the late signal 15 for generating the early' signal 28 and late' signal 29 is given.

TABLE I

Override control truth table

| Override_control_0 | Override_control_1 | Information feed through method |
|---|---|---|
| 0 | 0 | External early/late overrides internal early/late signal |
| 0 | 1 | External early/late is overridden by internal early/late |
| 1 | 0 | External early/late has the same priority as internal early/late |
| 1 | 1 | Switch off all contributions from the internal early/late |

The override control signals 13 determine the priority level that the external early/late signal 12 from the global edge processing unit 50 has compared to the internally generated edge information expressed in form of the internal early signal 14 and late signal 15. As an example, if both override control signals 13 are showing a logic high level, the edge information gained from the internal edge detector 6 is ignored during the generation of the early' signal 28 and late' signal 29. This is insofar different from the 0/0 case, as in the 0/0 case the internal early/late signals 14, 15 are only suppressed if simultaneously an external signal is present, but fed through if not. For the 1/1 setting, the contribution of the internal early/late signals 14, 15 is always suppressed. This allows to add an external filter that processes the early" and late" signals 37, 36 in a different way the internal digital filter would. In particular, it enables the addition of a counter to implement a high degree of averaging to implement a very low loop bandwidth. In the general case, it is also possible with some combinatorial logic to combine the internal early/late information 14, 15 and the global early/late information 12 with variable weighting. The weighting might even be dynamically adjusted.

It is preferred that the export early/late information 36, 37 fed to the global processing unit 50 originates only from macro-internal timing information, to guarantee stability. The external early/late information 12 from the global processing unit 50 is then only used during the generation of the early' and late' signals 28, 29 but not in the combinatorial logic for the early" signal 36 and late" signal 37. By using stability analysis, overlapping combination schemes between internal and global early/late signals 14, 15, 12 would however be also possible.

The additional logic implemented to generate the early/late signals 36, 37 for the global early/late processing unit 50 may be powered down to save power when not used.

Figure 4:
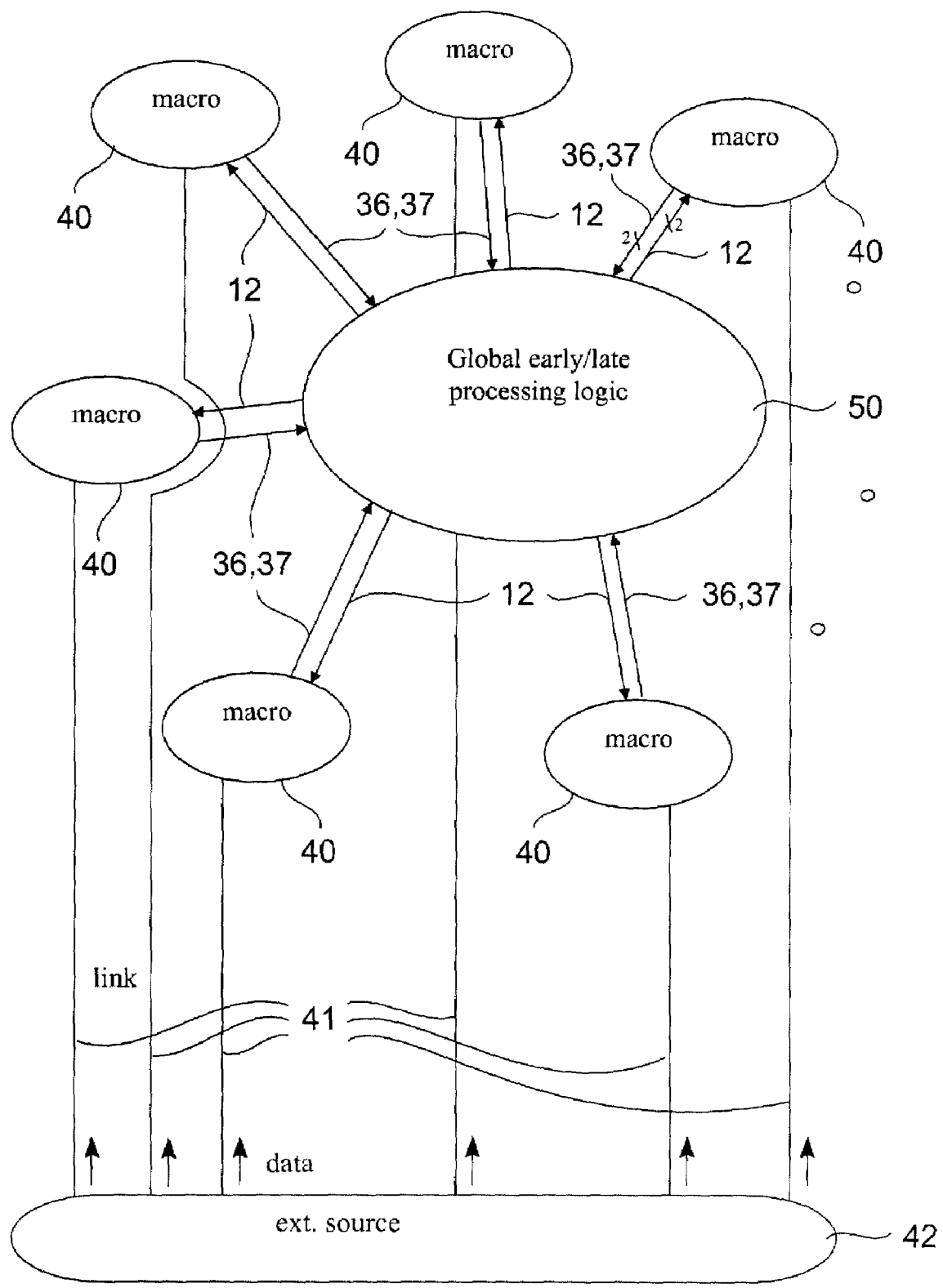

FIG. 4 gives a schematic view of several macros 40 surrounding one global early/late processing unit 50. Each macro 40 is feeding its locally generated early/late information 36, 37 to the global processing unit 50. Each macro 40 on the other hand receives phase update information 12 from the global processing unit 50. All the macros 40 are connected to an external data source 44 via links 41.

This information in form of the external early/late signal 12 contains the averaged and/or filtered early/late information 36, 37 from all other link macros. The table below shows and example for the conversion of early and late information from two macros, labelled Early resp. Late indexed with 1 and 2, into early/late signals 12, labelled as GlobalEarly and GlobalLate.

| Early1 | Late1 | Early2 | Late2 | => | GlobalEarly | GlobalLate |
|---|---|---|---|---|---|---|
| 0 | 0 | 0 | 0 | => | 0 | 0 |
| 0 | 0 | 0 | 1 | => | 0 | 1 |
| 0 | 0 | 1 | 0 | => | 0 | 1 |
| 0 | 0 | 1 | 1 | => | 0 | 1 |
| 0 | 1 | 0 | 0 | => | 1 | 0 |
| 0 | 1 | 0 | 1 | => | 0 | 0 |
| 0 | 1 | 1 | 0 | => | 0 | 0 |
| 0 | 1 | 1 | 1 | => | 0 | 1 |
| 1 | 0 | 0 | 0 | => | 1 | 0 |
| 1 | 0 | 0 | 1 | => | 0 | 0 |
| 1 | 0 | 1 | 0 | => | 0 | 0 |
| 1 | 0 | 1 | 1 | => | 0 | 1 |
| 1 | 1 | 0 | 0 | => | 1 | 0 |
| 1 | 1 | 0 | 1 | => | 1 | 0 |
| 1 | 1 | 1 | 0 | => | 1 | 0 |
| 1 | 1 | 1 | 1 | => | 0 | 0 |

During a period of a long-run length on one serial link 41 to a macro 40, the phase of this specific link 41 is still updated based on the average phase update action taken by all the other macros 40 via the global processing unit 50. Each single macro 40 hence provides its internal phase update information 36, 37 to all other macros 40 (one for all), and all other macros provide their internal phase update information 36, 37 to each single macro 40 (all for one).

The global early/late processing unit 50, also referred to as external early/late processing unit 50, hence allows to replace the internal digital loop filter characteristics, namely by overriding the internal early signal 14 and late signal 15 by the external phase update information 12 from the global logic unit 50. This overriding only adds very low CDR loop bandwidth capability.

The external early/late processing unit 50 also allows to enhance the internal digital loop filter chacteristics by sharing the internal early signal 14 and late signal 15 with other macros 40. The external early/late processing logic 50 provides a feedback of the edge-update information 12, i.e. external phase update information 12 or external early/late signal 12, gained from averaged early/late signals 36, 37 to all macros 40. For each macro 40 however, the override setting might be set different. Since the clock data recovery system has an input for the override control signal 13, this signal 13 can be provided from an external source as well. The external early/late processing unit 50 could be an ideal unit for containing the settings for the override control signals 13 for all connected macros 40. But it is also possible to have a local setting for one, several or all of the macros 40.

The information contained in the export early/late signals 36, 37 is also usefull for system-monitoring and supervision. The global processing unit 50 can namely, even in case no information is sent to the macros 40, provide an overview over the different export early signals 36 and export late signals 37. A case when the majority of macros 40 that receive their input data 8 from the same external source, shows regular and rather similar export early/late signals 36, 37, whereas the minority shows different export early/late signals 36, 37, this would be recognized in the monitor and could be interpreted e.g. as a form of macro defect.

The described global early/late processing unit 50 also allows to provide a means for full external control over phase rotator position. More precisely, this allows to use a CDR loop as the one depicted in FIG. 1 in full override mode, i.e. 0-0 override control input in table I, and without the input data signal 8, to generate a high-quality clock 24. The frequency of the clock 24 is then determined by the reference clock generator 1 and the early/late input rate of the external early/late signal 12 from the global processing unit 50 The generated clock 24 is frequency-locked to the average frequency present at all data inputs 8 of the macros feeding their external early/late signals 36, 37 to the external early/late processing unit 50. Such a clock 24 can be of great advantage to trigger transmitters in a loop-back round-trip link configuration as e.g. can be found in the OIF SPI-5 interface standard.

The described embodiments are combinable in part as well as in whole.

It is obvious for the person skilled in the art that the present invention can be realized in hardware, software, or a combination of these. Also, it can be implemented in a centralized fashion on one single computer system, or in a distributed fashion where different elements are spread across several interconnected computers or computer systems, whereby any kind of a computer system—or other apparatus adapted for carrying out the methods described herein—is suited. A typical combination of hardware and software could be a general purpose computer system with a computer program that, when being loaded and executed, controls the computer system such that it carries out the methods described herein. The present invention can also be embedded in a computer program product, which comprises all the features enabling the implementation of the methods described herein, and which—when loaded in a computer system—is able to carry out these methods.

Computer program means or computer program in the present context mean any expression, in any language, code or notation, of a set of instructions intended to cause a system having an information processing capability to perform a particular function either directly or after either or both of the following a) conversion to another language, code or notation; b) reproduction in a different material form.

Any disclosed embodiment may be combined with one or several of the other embodiments shown and/or described. This is also possible for one or more features of the embodiments.

It is obvious that a person skilled in the art can modify the shown arrangements in many ways without departing from the gist of the invention which is encompassed by the subsequent claims.

The invention claimed is:

1. A clock data recovery system for controlling a sampling clock signal according to an incoming data signal comprising
   a clock generator for generating said clock signal;
   a phase adjustment unit for generating sampling phases dependent on a phase adjustment control signal;
   a data sampling unit operable to generate a stream of input samples of said data signal;
   an edge detector for generating therefrom an internal early signal and an internal late signal;
   a phase adjustment control unit for generating under use of said early signal and said late signal said phase adjustment control signal, characterized in that said phase adjustment control unit is feedable with an external early and/or late signal which external early and/or late signal is based on early and/or late information obtained from measurements in one or more external clock data recovery entities, and/or comprises an output for delivering an export early and/or late signal outside the present clock data recovery system, and further comprises an input for an override control signal that determines a mode of combination between the internal early signal and internal late signal and the external early and/or late signal; and
   a sample-aligning stage for generating from said stream of input samples, being a serial stream, a parallel sample signal.

2. Clock data recovery system according to claim 1, further comprising an averaging filter for averaging a multitude of logic highs of the early signal to form an incrementing signal for a counter and for averaging a multitude of logic highs of the late signal to form a decrementing signal for said counter, whose reading is transformable into the phase adjustment control signal.

3. Clock data recovery system according to claim 1, wherein the internal early signal and the internal late signal are a multitude of sub-rate signals that are combined to a pre-processed early signal and a pre-processed late signal.

4. Clock data recovery system according to claim 2, wherein the internal early signal and the internal late signal are a multitude of sub-rate signals that are combined to a pre-processed early signal and a pre-processed late signal.

5. Clock data recovery system according to claim 1, wherein said external early and/or late signal is receivable from an external early/late processing unit or one or more different clock data recovery systems.

6. Clock data recovery system according to claim 5, wherein said early/late processing unit comprises a combinatorial logic for combining the export early signal with other export early signals and combining the export late signal with other export late signals.

7. Clock data recovery system according to claim 6, further comprising an averaging filter for averaging a multitude of logic highs of the early signal to form an incrementing signal for a counter and for averaging a multitude of logic highs of the late signal to form a decrementing signal for said counter, whose reading is transformable into the phase adjustment control signal.

8. Clock data recovery system according to claim 6, wherein the internal early signal and the internal late signal are a multitude of sub-rate signals that are combined to a pre-processed early signal and a pre-processed late signal.

9. Clock data recovery system according to claim 7, wherein the internal early signal and the internal late signal are a multitude of sub-rate signals that are combined to a pre-processed early signal and a pre-processed late signal.

10. A clock data recovery system for controlling a sampling clock signal according to an incoming data signal comprising
  a clock generator for generating said clock signal;
  a phase adjustment unit for generating sampling phases dependent on a phase adjustment control signal;
  a data sampling unit operable to generate a stream of input samples of said data signal;
  an edge detector for generating therefrom an internal early signal and an internal late signal;
  a phase adjustment control unit for generating under use of said early signal and said late signal said phase adjustment control signal, characterized in that said phase adjustment control unit is feedable with an external early and/or late signal which external early and/or late signal is based on early and/or late information obtained from measurements in one or more external clock data recovery entities, and/or comprises an output for delivering an export early and/or late signal outside the present clock data recovery system;
  a sample-aligning stage for generating from said stream of input samples, being a serial stream, a parallel sample signal; and
  an averaging filter for averaging a multitude of logic highs of the early signal to form an incrementing signal for a counter and for averaging a multitude of logic highs of the late signal to form a decrementing signal for said counter, whose reading is transformable into the phase adjustment control signal.

11. Clock data recovery system according to claim 10, wherein the internal early signal and the internal late signal are a multitude of sub-rate signals that are combined to a pre-processed early signal and a pre-processed late signal.

12. Clock data recovery system according to claim 10, wherein said external early and/or late signal is receivable from an external early/late processing unit or one or more different clock data recovery systems.

13. Clock data recovery system according to claim 12, wherein said early/late processing unit comprises a combinatorial logic for combining the export early signal with other export early signals and combining the export late signal with other export late signals.

14. Clock data recovery system according to claim 12, wherein the internal early signal and the internal late signal are a multitude of sub-rate signals that are combined to a pre-processed early signal and a pre-processed late signal.

15. A clock data recovery system for controlling a sampling clock signal according to an incoming data signal comprising
  a clock generator for generating said clock signal;
  a phase adjustment unit for generating sampling phases dependent on a phase adjustment control signal;
  a data sampling unit operable to generate a stream of input samples of said data signal;
  an edge detector for generating therefrom an internal early signal and an internal late signal;
  a phase adjustment control unit for generating under use of said early signal and said late signal said phase adjustment control signal, characterized in that said phase adjustment control unit is feedable with an external early and/or late signal which external early and/or late signal is based on early and/or late information obtained from measurements in one or more external clock data recovery entities, and/or comprises an output for delivering an export early and/or late signal outside the present clock data recovery system, and further comprises an input for an override control signal that determines a mode of combination between the internal early signal and internal late signal and the external early and/or late signal; and
  an averaging filter for averaging a multitude of logic highs of the early signal to form an incrementing signal for a counter and for averaging a multitude of logic highs of the late signal to form a decrementing signal for said counter, whose reading is transformable into the phase adjustment control signal.

16. Clock data recovery system according to claim 15, wherein the internal early signal and the internal late signal are a multitude of sub-rate signals that are combined to a pre-processed early signal and a pre-processed late signal.

17. Clock data recovery system according to claim 15, wherein said external early and/or late signal is receivable from an external early/late processing unit or one or more different clock data recovery systems.

18. Clock data recovery system according to claim 17, wherein said early/late processing unit comprises a combinatorial logic for combining the export early signal with other export early signals and combining the export late signal with other export late signals.

19. Clock data recovery system according to claim 17, wherein the internal early signal and the internal late signal are a multitude of sub-rate signals that are combined to a pre-processed early signal and a pre-processed late signal.

20. Clock data recovery system according to claim 18, wherein the internal early signal and the internal late signal are a multitude of sub-rate signals that are combined to a pre-processed early signal and a pre-processed late signal.

\* \* \* \* \*